(12) United States Patent
Ebensperger

(10) Patent No.: US 10,707,170 B2
(45) Date of Patent: Jul. 7, 2020

(54) POWER ELECTRIC SWITCHING DEVICE

(71) Applicant: SEMIKRON ELEKTRONIK GMBH & CO. KG, Nuremberg (DE)

(72) Inventor: Christina Ebensperger, Fürth (DE)

(73) Assignee: SEMIKRON ELEKTRONIK GmbH & CO. KG, Nuremberg (DE)

( * ) Notice: Subject to any disclaimer, the term of this patent is extended or adjusted under 35 U.S.C. 154(b) by 0 days.

(21) Appl. No.: 16/367,371

(22) Filed: Mar. 28, 2019

(65) Prior Publication Data
US 2019/0333860 A1    Oct. 31, 2019

(30) Foreign Application Priority Data

Apr. 25, 2018    (DE) .................... 10 2018 109 996

(51) Int. Cl.
*H01L 23/495* (2006.01)
*H01L 23/538* (2006.01)
(Continued)

(52) U.S. Cl.
CPC .......... *H01L 23/5386* (2013.01); *H01L 24/48* (2013.01); *H01L 25/072* (2013.01);
(Continued)

(58) Field of Classification Search
CPC ..... H01L 23/5386; H01L 24/48; H01L 24/49; H01L 25/072
(Continued)

(56) References Cited

U.S. PATENT DOCUMENTS 4,816,984 A * 3/1989 Porst ...................... H01L 25/18
                                                         323/289
8,228,113 B2 * 7/2012 Domes .................... H01L 24/49
                                                         327/427
(Continued)

FOREIGN PATENT DOCUMENTS

DE    102015120157    5/1917
EP    3 246 945          5/1916

OTHER PUBLICATIONS

DE 10 2018 109 996.7, Examination report dated Nov. 27, 2018, 3 pages—English, 7 pages—German.

*Primary Examiner* — Luan C Thai
(74) *Attorney, Agent, or Firm* — Lackenbach Siegel, LLP; Andrew F. Young

(57) ABSTRACT

The invention relates to a power electronic switching device having a substrate, which has a non-conductive insulation layer on which at least one first conductor track 40 and at least one second conductor track 50 are applied. The first conductor track 40 is assigned an electrical DC voltage potential DC+ of the power electronic switching device and the one second conductor track 50 is assigned an electrical AC voltage potential AC of the power electronic switching device. At three first partial power switches are arranged on the first conductor track. At least three second partial power switches are arranged on the second conductor track. The at least three first partial power switches are connected electrically in parallel with each other to form a first parallel circuit and the at least three second partial power switches are electrically connected in parallel with each other to form a second parallel circuit. The at least three first partial power switches and the at least three second partial power switches are arranged on the substrate 30 in a chessboard-like pattern.

10 Claims, 3 Drawing Sheets

(51) Int. Cl.
*H01L 25/07* (2006.01)
*H01L 23/00* (2006.01)

(52) U.S. Cl.
CPC .... *H01L 24/49* (2013.01); *H01L 2224/48137* (2013.01); *H01L 2224/48225* (2013.01); *H01L 2224/49175* (2013.01); *H01L 2924/13055* (2013.01); *H01L 2924/13091* (2013.01)

(58) Field of Classification Search
USPC ....................................................... 257/668
See application file for complete search history.

(56) References Cited

U.S. PATENT DOCUMENTS

| | | |
|---|---|---|
| 9,899,283 B2* | 2/2018 | Cottet .................... H01L 25/18 |
| 2005/0024805 A1 | 2/2005 | Heilbronner et al. |

\* cited by examiner

POWER ELECTRIC SWITCHING DEVICE

CROSS REFERENCE TO RELATED APPLICATIONS

This application relates to, and claims priority from, DE Ser. No.: 10 2018 109 996.7 filed on Apr. 25, 2018, the entire contents of which are incorporated herein by reference.

FIGURE SELECTED FOR PUBLICATION

FIG. 2.

BACKGROUND OF THE INVENTION

Field of the Invention

The present invention relates to a power electronic switching device, which can form a basic cell of a power semiconductor module or a power electronic system, by forming either alone or in combination with other, preferably identical basic cells, the basic building block of the power electronic power semiconductor module or the power electronic system.

Description of the Related Art

Power electronic switching devices comprise a plurality of partial power switches, which are arranged next to each other in a row and are connected in parallel. In operation these partial power switches usually generate non-negligible electrical losses, which to a large extent are converted into waste heat. This waste heat does not affect the functionality or the service life of the electronic and/or electrical components.

Such a switching device is disclosed in DE 10 2015 120 157 A1. Here, a power electronic switching device implemented with a substrate is disclosed which has a multiplicity of potential areas, wherein at least two different potentials are assigned to at least one of these potential areas each, wherein on a first conductor track, formed by at least one potential surface of first potential a multiplicity of semiconductor components are arranged in a n×m matrix, oriented in the x-y-direction, which are connected in parallel with each other and form a current control valve. Here, the semiconductor elements are distributed on a multiplicity of potential areas of first potential, which form the first conductor track. These are arranged on a heat sink and a thermally conductive interconnection layer, in order to provide heat dissipation in the operation of the switching device.

ASPECTS AND SUMMARY OF THE INVENTION

It is technically desirable to specify a switching device which reduces the temperature of the power switches in operation and thus provides an improved functionality and longer service life of the switching device.

Having regard to the circumstances mentioned above, the object of the invention is to specify a switching device which is improved in terms of functionality and service life.

This problem is solved by means of a power electronic switching device having the features of claim 1. The dependent claims list further advantageous measures which can be combined as desired in order to achieve further advantages.

The object is achieved according to the invention by specifying a power electronic switching device with a substrate which has a non-conductive insulation layer on which at least one first conductor track and at least one second conductor track are applied, wherein the at least one first conductor track is assigned an electrical DC voltage potential of the power electronic switching device and the at least one second conductor track is assigned an electrical AC voltage potential of the power electronic switching device, wherein at least three first partial power switches are arranged on the at least one first conductor track and electrically conductively connected to the first conductor track, wherein at least three second partial power switches are arranged on the at least one second conductor track and are electrically conductively connected to the second conductor track, wherein the first partial power switches are electrically connected in parallel with each other to form a first parallel circuit and the second partial power switches are electrically connected in parallel with each other to form a second parallel circuit, wherein the first partial power switches and second partial power switches are arranged on the substrate in a chessboard-like pattern.

The chessboard-like arrangement results in an alternating distribution of the partial power switches. Due to the chessboard-like arrangement of the partial power switches and therefore the physically spaced arrangement of each middle partial power switch, the thermal influence from the two outer partial power switches is at least significantly reduced.

Here, a chessboard-like arrangement means that in the case of an arrangement of the at least three partial power switches the middle partial power switch of the at least three partial power switches is spaced apart from the other two outer partial power switches not only in the x direction (or y-direction), but also in the y-direction (or x-direction). The distance in the y-direction (or x-direction) can also be minimal. The greater the distance in the y-direction (or x-direction), the more the thermal influence of the two outer partial power switches is reduced.

The first and the second parallel circuit are preferably electrically connected to each other in series.

In the context of the invention, it was observed that the mutual thermal influence of parallel-connected partial power switches affects the functionality and service life of the entire switching device. This applies in particular to partial power switches in the middle of two other partial power switches, which are thermally influenced by the two surrounding partial power switches.

Due to the invention, in a parallel operation the middle partial power switch is less adversely affected due to heat by the outer partial power switches. A higher temperature will adversely affect the performance data of the partial power switches and has a negative impact on the service life of partial power switches. The ambient temperature of the middle partial power switch is reduced due to the increased additional spacing, which means the middle partial power switch in operation can dissipate higher temperature to its surroundings. As a result, the temperature of the middle partial power switch is significantly reduced, resulting in a longer service life and improved functionality of the switching device.

In a preferred embodiment the first conductor track and the second conductor track are designed with a meandering pattern. This results in a particularly space-saving arrangement on the substrate. In this design, the conductor tracks are designed contiguously, so that connection devices for the same potential can be eliminated.

In a further preferred arrangement, more than three first partial power switches and more than three second partial power switches are arranged on the substrate in a chessboard-like pattern. This also enables switching devices with more than three partial power switches in each case to be improved in terms of functionality and durability due to the thermal decoupling of the middle partial power switch.

Preferably, the at least three first partial power switches and the at least three second partial power switches are implemented as field effect transistors, in particular as MOSFETs or as bipolar transistors, in particular IGBTs with or without associated freewheeling diodes. Other embodiments are also possible, provided they are expedient.

It is particularly advantageous if the at least one first conductor track has one or more first conductor track sections and the at least one second conductor track has one or more second conductor track sections and a first connection device is provided, wherein the first conductor track sections and/or the second conductor track sections are connected by means of the first connection device. Due to the individual conductor track sections it is possible to achieve a maximally space-saving chessboard-like arrangement of the partial power switches on the substrate.

The first connection device can preferably be designed as a wire bond connection. Alternatively, the first connection device can be implemented as an electrically conductive film, in particular a metallic film. The advantages gained by using a film are the use of cost-effective materials and the simple connection to other components by welding or sintering, as well as the greater degree of freedom in the design of the conductor tracks.

It is particularly advantageous if a second connection device is provided, wherein the second connection device forms additional circuit-compatible connections, here for example, auxiliary and/or load terminals. These are used for external electrical connection. The load connection elements are designed, purely as an example, as metallic formed bodies which are connected in a materially-bonded manner to a conductor track of the substrate via a contact pad, advantageously also by means of a pressure-sintered connection. In accordance with standard practice, these load connection elements can also be implemented as contact springs. In principle, parts of the connection device itself can be designed as load or auxiliary connection elements. Also, the auxiliary connection elements can be gate or sensor terminals, which are preferably also designed in a standard manner.

The first connection device and the second connection device are preferably formed jointly as a film composite with at least a first and a second electrically conductive film and an electrically insulating film, wherein the electrically insulating film is arranged between the first electrically conductive and the second electrically conductive film. The film composite can also be connected in a materially-bonded manner in sections, in each case to a contact surface of a power semiconductor component or to a contact surface of a conductor track of the substrate. Also, the film composite can have a multiplicity of such films, with alternating insulating and electrically conductive films.

More preferably, feed-through contacts are provided, which are arranged through the insulating film from the first to the second conductive film.

A third conductor track of the substrate is preferably provided, which is assigned a third load potential, in particular an electrically negative DC voltage potential. The third conductor track is designed to be u-shaped and surrounds the first and second conductor track, at least partially. The use of a u-shaped design enables the individual load potentials on the individual conductor tracks to be electrically well connected to each other in a circuit-compatible manner. Load bond connections can extend from contact surfaces of the partial power switches of the first power switch that face away from the substrate, which are arranged in operation on the load potential area at positive DC voltage potential, up to the second load potential area with alternating voltage in operation, which in turn can be connected via their second partial power switches to the load potential area of the substrate with negative DC voltage potential in operation. The third conductor track can be designed differently, in particular much smaller, and in particular in connection with a film composite to provide the top side contacting.*

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
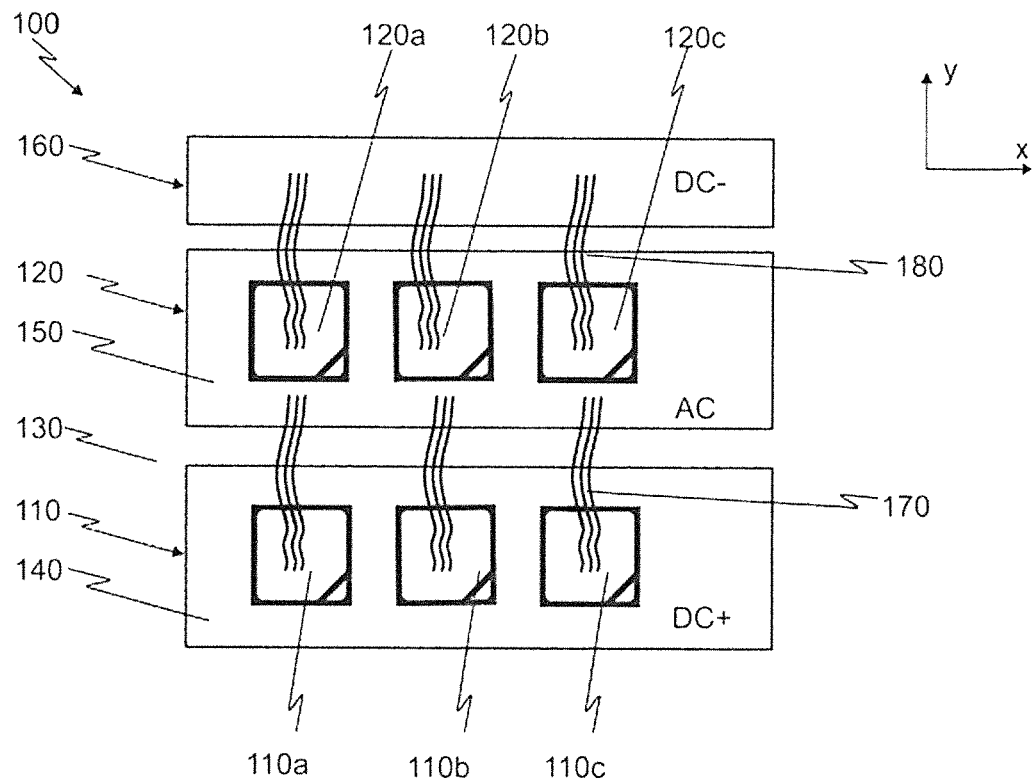
FIG. 1 is a first switching device 100 in accordance with the state of the art.

Reference will now be made in detail to embodiments of the invention. Wherever possible, same or similar reference numerals are used in the drawings and the description to refer to the same or like parts or steps. The drawings are in simplified form and are not to precise scale. The word 'couple' or 'link' or 'connect' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

In the present text, numerous specific details are set forth in order to provide a thorough understanding of exemplary versions of the present invention. It will be apparent, however, to one skilled in the art, that some versions of the present invention may possibly be practiced without some of these specific details. Indeed, reference in this specification to "a variant," "variants," preference, and "one/the variant," or "one version" and the like, should be understood to mean that a particular feature, structure, or characteristic described in connection with the variant or version is included in at least one such variant or version according to the disclosure. Thus, the appearances of phrases such as "in one variant," "in one version," and the like, in various places in the specification are not necessarily all referring to the same version or variant, nor are separate or alternative versions or variants mutually exclusive of other versions or variants.

Moreover, various features may be described which possibly may be exhibited by some variants or versions and not by others. Similarly, various requirements are described which may be requirements for some variants or versions, but not others. Furthermore, as used throughout this specification, the terms 'a', 'an', 'at least' do not denote a limitation of quantity, but rather denote the presence of at least one of the referenced item, in the sense that singular reference of an element does not necessarily exclude the plural reference of such elements. Concurrently, the term "a plurality" denotes the presence of more than one referenced items. Finally, the terms "connected" or "coupled" and related terms are used in an operational sense and are not necessarily limited to a direct connection or coupling.

Various operations may be described as multiple discrete operations in turn, in a manner that may be helpful in understanding embodiments of the present invention; however, the order of description should not be construed to imply that these operations are order dependent.

FIG. 1 shows a first switching device 100 according to the state of the art. The first switching device 100 is designed in a half-bridge topology and therefore comprises, in accordance with standard practice, a first power switch 110 and a second power switch 120. Both power switches 110, 120 are implemented by means of three partial power switches 110a, 110b, 110c, 120a, 120b, 120c; these can be designed, for example, as an IGBT with an associated free-wheeling diode in each case, or as a MOSFET. This configuration, with three partial power switches each can also be modified in a standard manner without restriction of generality to comprise more than three partial power switches.

The respective power switches 110, 120 are arranged on a substrate 130, which is composed of an electrically insulating insulator body on which a multiplicity of load potential areas is arranged in the form of conductor tracks 140,150,160 that are electrically insulated from each other. The three pairs of partial power switches 110a, 110b, 110c and 120a, 120b, 120c have a semiconductor underside, which faces the substrate 130 and with which they are electrically conductively connected to the respective potential area. The substrate 130 associated with the first power switch 110 has a first conductor track 140 with a positive DC voltage potential on the DC+ in operation, on which the first power switch 110 is also arranged. From contact areas of the partial power switches 110a, 110b, 110c of the first power switches 110, here the top of the semiconductor, that face away from the substrate 130 load bond connections 170 extend to the second conductor track 150, to which here an AC voltage potential AC is assigned in operation. In addition, the substrate 130 also has a third conductor track 160 with a negative DC voltage potential DC− in operation. From contact areas of the partial power switches 120a, 120b, 120c of the second power switches 120, here the top of the semiconductor, that face away from the substrate 130 load bond connections 180 extend to the third conductor track 160.

The first switching device 100 has load bond connections 170, here wire bond connections, which extend from contact surfaces of the partial power switches 110a, 110b, 110c of the first power switch 110 that face away from the substrate 130, said power switch being arranged on the conductor track 140 at a positive DC voltage potential DC+ during operation, up to the second conductor track 150 with alternating voltage AC in operation, which in turn is connected via its partial power switches 120a, 120b, 120c by means of load bond connections 180 to the third conductor track 160 at negative DC voltage potential DC− of the substrate 130 during operation.

DC voltage load connection elements (not shown) are preferably electrically conductively connected to the associated first and third conductor track 140, 160 of the substrate 130, while a designed AC voltage load connection element (not shown) is electrically conductively connected to the associated second conductor track 150 of the substrate 130.

The respective partial power switches 110a, 110b, 110c, 120a, 120b, 120c of the first and second power switch 110,120 are arranged in series on the conductor tracks 140, 150.

In the context of the invention, it was observed that in operation the middle first partial power switch 110b and the middle second partial power 120b switch of the switching device 100 are heated to a greater extent than the two outer partial power switches 110a, 110c and the outer partial power switches 120a, 120c. This is caused by the heating of the outer partial power switches 110a, 110c, 120a, 120c. The middle partial power switch 110b, 120b can dissipate less temperature into its surroundings, since due to the two outer partial power switches 110a, 110c, 120a, 120c its ambient temperature is higher than the ambient temperature of the two outer partial power switches 110a, 110c, 120a, 120c. This causes the middle partial power switch 110b, 120b to become hotter in operation than the other outer partial power switches 110a, 110c, 120a, 120c; however, the effect of this is to reduce the functionality and the lifetime of each middle first partial power switch 110b and second partial power switch 120b. This has an impact on the functionality and service life of the entire switching device 100.

Figure 2:
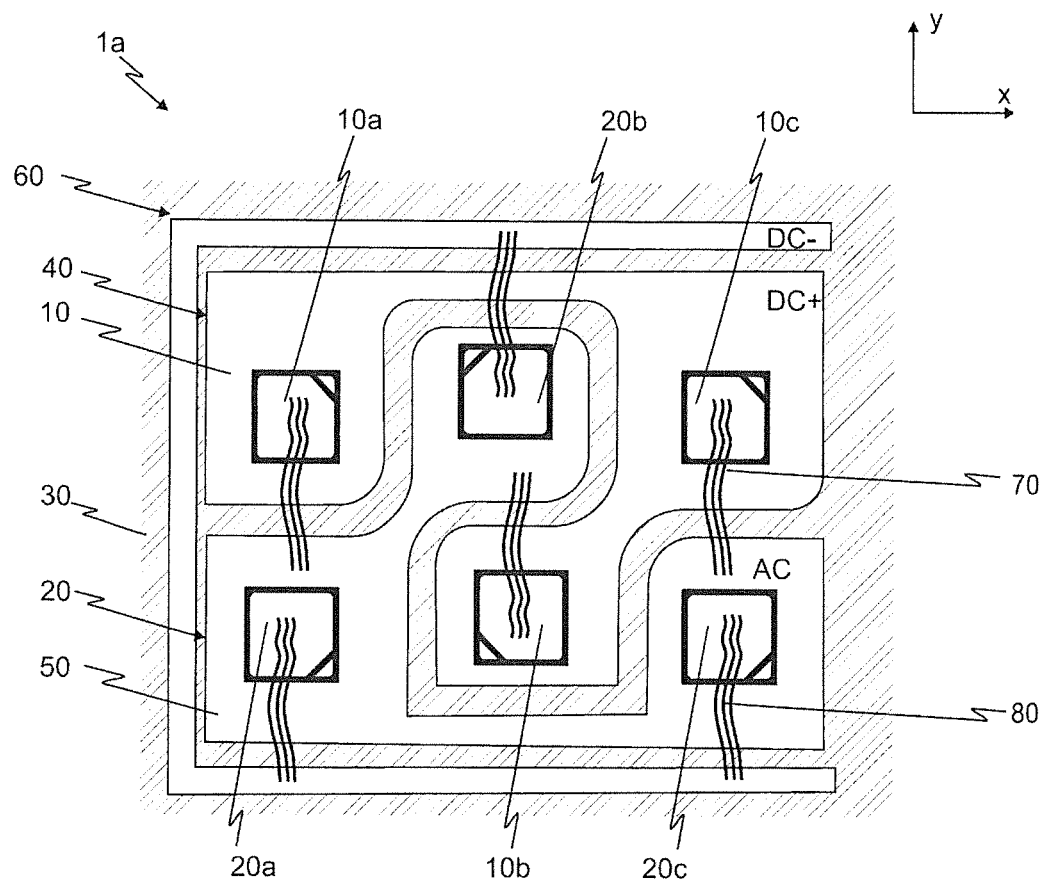
FIG. 2 is a first exemplary embodiment of a switching device 1a according to the invention.

FIG. 2 shows a first configuration of a switching device 1a according to the invention. The switching device 1a is designed in a half-bridge topology and therefore comprises, in accordance with standard practice, a first power switch 10 and a second power switch 20. Both power switches 10, 20 have three partial power switches 10a, 10b, 10c, 20a, 20b, 20c; which can be designed, for example, as IGBTs with or without an associated free-wheeling diode, or as MOSFETs. This configuration with three IGBTs and three free-wheeling diodes in each case can also be modified according to the invention without restriction of generality to comprise more than three power switches.

The respective power switches 10, 20 are arranged on a substrate 30, which is composed of an electrically insulating insulator body on which a multiplicity of load potential areas is arranged in the form of conductor tracks 40, 50, 60 that are electrically insulated from each other. The first conductor track 40 associated with the first power switch 10, on which the three first partial power switches 10a, 10b, 10c are also arranged, has a positive DC voltage potential DC+ in operation.

The second three partial power switches 20a, 20b, 20c of the second power switch 20 are here arranged on a second conductor track 50 with a second load potential area, which in operation has an AC voltage potential AC. The first three partial power switches 10a, 10b, 10c and the second three partial power switches 20a, 20b, 20c are each connected in parallel. The first three partial power switches 10a, 10b, 10c and the second three partial power switches 20a, 20b, 20c are arranged in a chessboard-like pattern, which means an alternating arrangement of the three first partial power switches 10a, 10b, 10c and the three second partial power switches 20a, 20b, 20c exists. Therefore, the first middle partial power switch 10b is thermally decoupled from the two outer partial power switches 10a, 10c. The same applies to the second middle partial power switch 20b. This arrangement means that the middle partial power switches 10b, 20b are thermally decoupled and are not heated so quickly. This helps to increase the service life of the switching device and to improve the functionality. The thermal influence of parallel-connected partial power switches is thus reduced.

Both the first conductor track 40 and the second conductor track 50 are designed in a meandering pattern. This means that it is simpler to arrange the first partial power switches 10a, 10b, 10c and the second partial power switches 20a, 20b, 20c in a chessboard pattern. The meandering construction of both the first conductor track 40 and the second conductor track 50 enables a simplified circuit-compatible first connection device to be implemented. The first connection device can be implemented using wire bond connections 70, 80 as a connection device.

Alternatively, the first connection device can be formed as a film composite with at least a first and a second electrically conductive film and an electrically insulating film, and the electrically insulating film is arranged between the first electrically conductive and the second electrically conductive film. The film composite can also be connected in a materially-bonded manner in sections, in each case to a contact surface of a power semiconductor component or to a contact surface of a conductor track of the substrate 30. Also, the film composite can have a multiplicity of films, with alternating insulating and electrically conductive films. The film stack results in a greater degree of freedom for surface contacting.

From contact areas of the first partial power switches 10a, 10b, 10c of the first power switch 10, here the top of the semiconductor, that face away from the substrate 30 load bond connections 70 extend to a second conductor track 50, which in operation has the AC voltage potential AC.

In addition, the substrate 30 also has a third conductor track 60 with a third load potential area at negative DC voltage potential DC− in operation.

The third conductor track 60 in this case is u-shaped and encloses both the first conductor track 40 and the second conductor track 50, thus resulting in an improved circuit-compatible connection of the partial power switches 10a, 10b, 10c, 20a, 20b, 20c. A simple production of a circuit-compatible overall connection is thus possible.

From contact areas of the partial power switches 20a, 20b, 20c of the second power switch 20, here the top of the semiconductor, which face away from the substrate 30, load bond connections 80 extend to the third conductor track 60.

The meandering construction of both the first conductor track 40 and the second conductor track 50 enables a space-saving arrangement of the partial power switches 10a, 10b, 10c, 20a, 20b, 20c in a chessboard-like pattern.

The partial power switches 10a, 10b, 10c, 20a, 20b, 20c here are configured as MOSFETs with intrinsic diode.

The substrate 30 is usually directly or indirectly connected to a heat sink (not shown). The substrate 30 can be, for example, in the form of a DCB (direct bonded copper) substrate. The substrate 30 has a structured electrically conductive metal layer, which as a result of its structure forms conductor tracks.

Due to the invention, in a parallel operation the first and second middle partial power switches 10b, 20b are thermally less negatively affected by the respective other associated partial power switches 10a, 10c, 20a, 20c in the direction of higher temperature. With an offset in the y-direction of each middle partial power switch 10b, 20b as a result of the chessboard-like arrangement of the partial power switches 10a, 10b, 10c, 20a, 20b, 20c, the thermal influence of the other two partial power switches 10a, 10c, 20a, 20c is significantly reduced. The ambient temperature of each middle partial power switch 10b, 20b is reduced due to the increased spacing in the y-direction, which means the middle partial power switches 10b, 20b can dissipate higher temperatures to their surroundings in operation.

Figure 3:
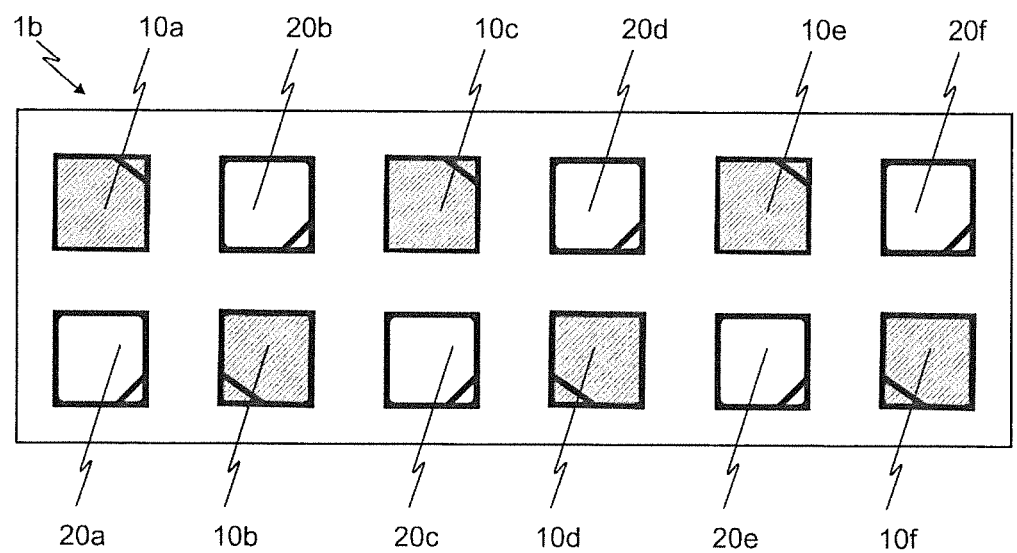
FIG. 3 is a second schematic example of a switching device 1b according to the invention.

FIG. 3 shows a schematic drawing of a second configuration of the invention. Here, the power electronic switching device 1b with a first and second power switch, not shown, comprises partial power switches 10a, 10b, 10c, 10d, 10e, 10f and 20a, 20b, 20c, 20e, 20d, 20f, which are connected in parallel. The partial power switches 10a, 10b, 10c, 10d, 10e, 10f and 20a, 20b, 20c, 20e, 20d, 20f are arranged in a chessboard-like pattern. To illustrate the chessboard-like arrangement, the partial power switches 10a, 10b, 10c, 10d, 10e, 10f are shown shaded, while the partial power switches 20a, 20b, 20c, 20e, 20d, 20f are shown in white. All the partial power switches 10a, 10b, 10c, 10d, 10e, 10f and 20a, 20b, 20c, 20e, 20d, 20f, however, as in other exemplary embodiments, can be implemented as MOSFETs with intrinsic diode.

The associated first and second conductor tracks can be designed in a meandering pattern. Thus, the middle partial power switches 10b, 10d, 10f and 20b, 20d, 20f are thermally decoupled from the other partial power switches 10a, 10c, 10e and 20a, 20c, 20e surrounding them. A plurality of partial power switches can also be provided.

Figure 4:
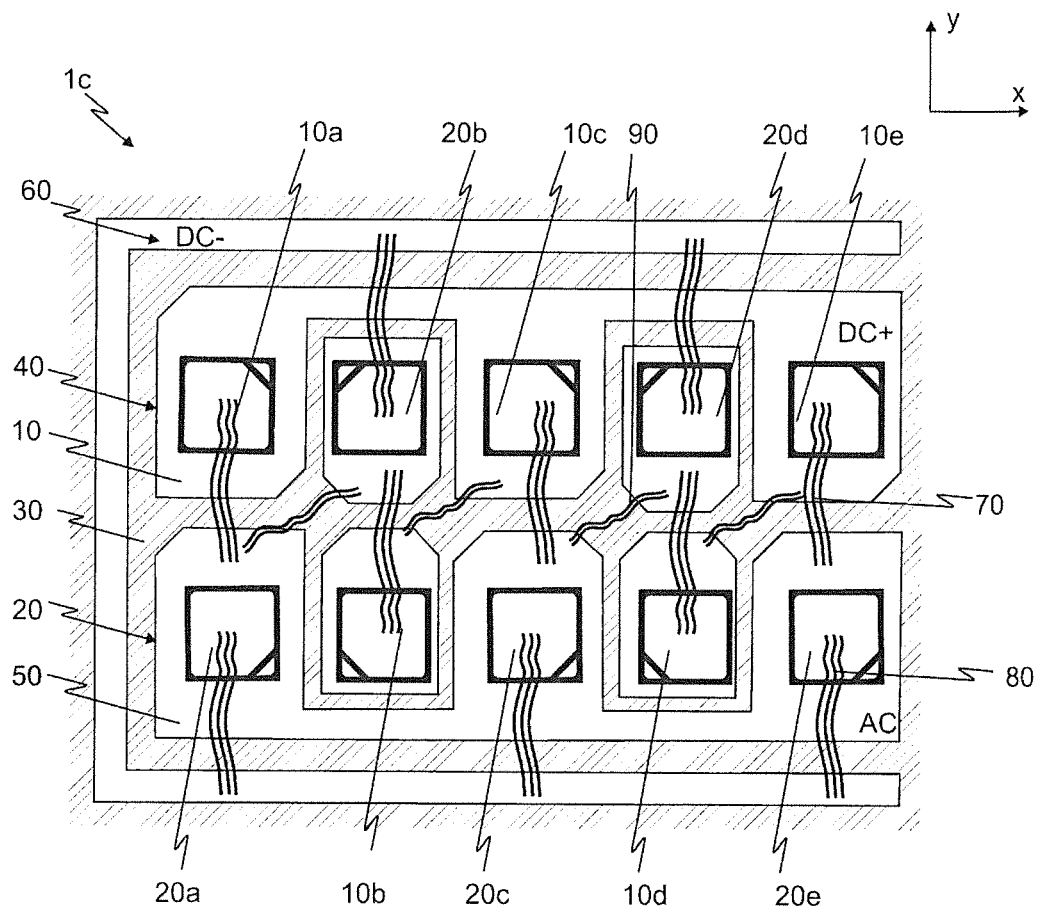
FIG. 4 is a third exemplary embodiment of a switching device 1c according to the invention.

FIG. 4 shows a third configuration of the invention. Here, the power electronic switching device 1c with a first and second power switch 10, 20, comprises five partial power switches 10a, 10b, 10c, 10d, 10e and 20a, 20b, 20c, 20d, 20e. The first conductor track 40 associated with the power switch 10 has a first load potential area 40 with positive DC voltage potential DC+ in operation, on which the five first partial power switches 10a, 10b, 10c, 10d, 10e are also arranged. The second conductor track 50 associated with the power switch 20 has a second load potential area with AC voltage potential AC in operation, on which the five second partial power switches 20a, 20b, 20c, 20d, 20e are also arranged. The conductor tracks 40 and 50 in this exemplary embodiment are not designed to be contiguous. Instead, the partial power switches 20b, 20d and 10b, 10d are arranged on separate conductor track sections, which are connected to the respective conductor track 40, 50 with a wire bond connection 90 in order to produce an AC voltage potential AC in operation on the partial power switches 20b, 20d and to produce a positive DC voltage potential DC+ in operation on the partial power switches 10b, 10d.

From contact areas of the partial power switches 10a, 10b, 10c, 10d, 10e of the first power switch 10, here the top of the semiconductor, facing away from the substrate 30, load bond connections 70 extend to of the second load potential area 50, which in operation has the AC voltage potential AC. In addition, the substrate 30 also has a third conductor track 60 with a third load potential area with a negative DC voltage potential DC− in operation. From contact areas of the partial power switches 20a, 20b, 20c, 20d, 20e of the second power switch 20, here the top of the semiconductor, which face away from the substrate 30, load bond connections 80 extend to the third conductor track 60.

The third conductor track 60 with a third load potential area encloses the first and second conductor track 40, 50 in a u-shaped manner. Therefore the second partial power switches 20a, 20b, 20c, 20d, 20e arranged in a chessboard pattern can be connected in a simplified way to the third conductor track 60 with the negative DC voltage potential DC− in operation, by means of wire bond connections 80.

It is further observed that, naturally, characteristics of the various exemplary embodiments of the invention, provided that said characteristics are not mutually exclusive, can be mutually combined as desired, without departing from the scope of the invention.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power electronic switching device, comprising:
   a substrate, which has a non-conductive insulation layer on which at least one first conductor track and at least one second conductor track are applied;
   the at least one first conductor track is assigned an electrical DC voltage potential (DC+) of the power electronic switching device and the at least one second conductor track is assigned an electrical AC voltage potential (AC) of the power electronic switching device;
   at least three first partial power switches are arranged on the at least one first conductor track and are electrically conductively connected to the first conductor track;
   at least three second partial power switches are arranged on the at least one second conductor track and electrically conductively connected to the second conductor track;
   the at least three first partial power switches are connected electrically in parallel with each other to form a first parallel circuit and the at least three second partial power switches are electrically connected in parallel with each other to form a second parallel circuit; and
   the at least three first partial power switches and the at least three second partial power switches are respectively arranged on the substrate in a chessboard-like pattern.

2. The power electronic switching device, according to claim 1, wherein:
   the first and the second parallel circuit are electrically connected to each other in series.

3. The power electronic switching device, according to claim 1, wherein:
   a plurality of first partial power switches and a plurality of second partial power switches are arranged on the substrate in a chessboard-like pattern.

4. The power electronic switching device, according to claim 1, wherein:
   wherein the at least three first partial power switches and the at least three second partial power switches are implemented as field effect transistors, in particular as MOSFETs or as bipolar transistors, in particular IGBTs with or without an associated free-wheeling diode.

5. The power electronic switching device, according to claim 1, wherein:
   the at least one first conductor track has one or more first conductor track sections and the at least one second conductor track has one or more second conductor track sections and a first connection device is provided, wherein the first conductor track sections and/or the second conductor track sections are connected by means of the first connection device.

6. The power electronic switching device, according to claim 5, wherein:
   the first connection device is implemented as a wire bond connection.

7. The power electronic switching device, according to claim 5, wherein:
   the first connection device is implemented as an electrically conductive foil, in particular metallic foil.

8. The power electronic switching device, according to claim 5, wherein:
   a second connection device is provided; and
   the second connection device forms additional circuit-compatible connections, in particular auxiliary and/or load connectors.

9. The power electronic switching device, according to claim 8, wherein:
   the first connection device and the second connection device are formed jointly as a film composite with at least a first and a second electrically conductive film and an electrically insulating film, and the electrically insulating film is arranged between the first electrically conductive and the second electrically conductive film.

10. The power electronic switching device, according to claim 1, wherein:
    a third conductor track is provided, to which a third load potential, in particular an electrically negative DC voltage potential (DC−), is assigned; and
    wherein the third conductor track is u-shaped and at least partially encloses the first conductor track and the second conductor track.

* * * * *